US006456222B1

(12) United States Patent
Agne

(10) Patent No.: US 6,456,222 B1
(45) Date of Patent: Sep. 24, 2002

(54) SENSOR SIGNAL CONVERTER FOR MACHINE TOOLS AND PRODUCTION MACHINES, AND ALSO ROBOTS

(75) Inventor: Werner Agne, Röthenbach (DE)

(73) Assignee: Siemens Aktiengesellschaft (DE)

( * ) Notice: Subject to any disclaimer, the term of this patent is extended or adjusted under 35 U.S.C. 154(b) by 0 days.

(21) Appl. No.: 09/922,897

(22) Filed: Aug. 6, 2001

(30) Foreign Application Priority Data

May 25, 2001 (DE) ........................................ 101 25 608

(51) Int. Cl.[7] ................................................ H03M 1/06
(52) U.S. Cl. ....................................... 341/157; 341/155
(58) Field of Search ................................ 341/155, 157, 341/120, 118

(56) References Cited

U.S. PATENT DOCUMENTS 6,278,389 B1 * 8/2001 Lochmann .................. 341/155

OTHER PUBLICATIONS

Simovert Masterdrive SLE/SLE–DP–SOMOLINK–Encoder, GEW–477 763 4070.76 J. (no date given).

* cited by examiner

*Primary Examiner*—Brian Young
(74) *Attorney, Agent, or Firm*—Baker Botts L.L.P.

(57) ABSTRACT

The invention relates to a sensor signal converter for machine tools and production machines, and also robots, which generates pulsed signals from sensor values transmitted via a drive bus. The sensor signals (GU1, GU2) can be transmitted on the drive bus (AB1–AB4) in real time, can be converted into sensor-compatible pulsed signals by a sensor signal converter (GU1, GU2) in real time and can be sent to other appliances, optionally in real time. The data link (AB1–AB4) having real-time capability which can be used is an Ethernet having real-time capability.

8 Claims, 1 Drawing Sheet

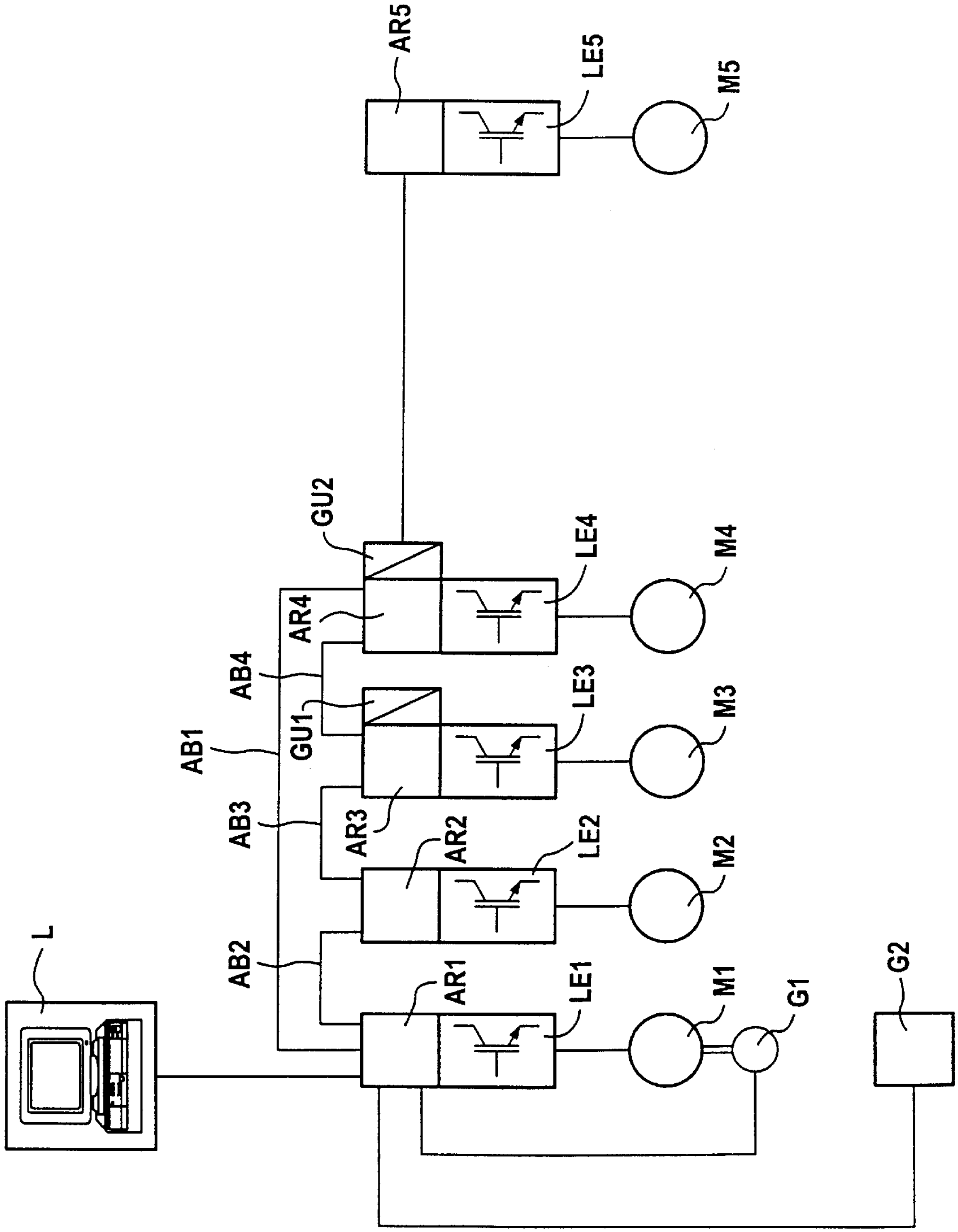
AR5
LE5
M5
GU2
LE4
M4
AR4
AB4
LE3
M3
GU1
AB1
AB3
AR3
AR2
LE2
M2
AB2
AR1
LE1
M1
G1
G2
L

SENSOR SIGNAL CONVERTER FOR MACHINE TOOLS AND PRODUCTION MACHINES, AND ALSO ROBOTS

FIELD OF THE INVENTION

The invention relates to a sensor signal converter for machine tools and production machines, and, robots, hereinafter machines which generate pulsed signals from sensor values transmitted via a drive bus.

BACKGROUND OF THE INVENTION

SIMOVERT MASTERDRIVES SLE/SLE-DP-SIMOLINK-Encoder, GWE-477 763 4070.76J, Siemens AG 2001 discloses an encoder which simulates sensor values on an electrical shaft and provides a central actual machine value (actual position value) which is generated from a reference nominal value. The SIMOLINK encoder generates two pulsed signals shifted through 90° and a zero pulse from a nominal angle value transported by means of SIMOLINK (optical waveguide connection). These are made available to other appliances by the encoder via RS422. The encoder thus simulates a pulse sensor with selectable, programmable quantization intervals.

SUMMARY OF INVENTION

It is an object of the present invention to provide a sensor signal converter which can respectively receive, convert and forward sensor signals in real time. The present invention achieves this object as a result of 1) sensor signals being able to be transmitted on a drive bus in real time; 2) the signals being able to be converted into sensor-compatible pulsed signals by a sensor signal converter in real time; and 3) the signals being able to be sent to other appliances in real time. The novel design of the sensor signal converter enables appliances which are not compatible with the main drive bus, for example drives from different manufacturers, to be coupled on a drive technology basis by means of a sensor interface.

A preferred embodiment of the present invention is characterized in that a control computer generates synthetic nominal values for at least one signal sensor converter and/or at least one drive regulator. Thus, various process information and/or process stipulations can be used in a control computer to generate synthetic nominal values. These values can be changed according to program execution and/or process flow.

In another preferred embodiment of the invention, a control computer receives nominal values from at least one further automation component. Thus, nominal values can advantageously be sent from automation components to a sensor converter using a control computer, for example, a drive bus. In this context, the control computer can serve as conversion component if the automation component prescribing nominal values cannot be compatibly connected to the sensor converter. Similarly, nominal value corrections or alterations can be made in the control computer.

In yet another preferred embodiment of the invention, a real and a synthetic nominal value source is flexibly assigned to at least one sensor signal converter using a control computer and/or a drive regulator. Hence, nominal value sources can be arbitrarily assigned to sensor converters in the configuration phase of a technical installation.

In still another preferred embodiment of the invention, a real and a synthetic nominal value source is flexibly assigned during operation on the basis of a mode of operation and/or execution of a program and/or an instance of fault. In this way, nominal value sources can be flexibly assigned to sensor converters according to demand and requirement even during operation of a technical installation.

Preferably, a clock signal can be produced or derived in the sensor signal converter in synchronism with the communication clock of the input data link having real-time capability. Thus, clock generation or formation in the sensor signal converter takes place strictly in synchronism with the transmission clock.

It is preferred that the sensor signal converter is an integral part of a drive regulator. This means that integral system resources of the drive regulator can advantageously be used. This minimizes the hardware costs and the complexity of installation for appliances or drives. Further, at least one real-time data link which can be used for the drive regulator is an Ethernet which makes it possible to use a standardized bus protocol which can be used universally and permits a high transmission capacity. Short bus cycles allow data to be transmitted in the system with real-time capability, which permits nominal value discrepancies to be quickly corrected.

DRAWINGS

An exemplary embodiment of the invention is shown in the drawing and is explained in more detail below. In the drawing:

FIG. 1 shows an association of drives with a data link, having real-time capability, and sensor signal converters.

DETAILED DESCRIPTION OF THE INVENTION

FIG. 1 shows an association of drives which has data links AB1 to AB4 having real-time capability. In this case, a drive comprises at least one electrically driven motor M1 to M5, a converter containing power electronics LE1 to LE5, and a drive regulator AR1 to AR5. As shown in FIG. 1, the power electronics LE1 to LE5 are marked by a rectangle with an IGBT symbol (Insulated Gate Bipolar Transistor). A drive regulator AR1 to AR5 can have further data links which connect it, by way of example, to a control computer L or sensors G1, G2. The drive regulators AR1 to AR4 have a drive bus AB1 to AB4 having real-time capability which is in the form of a ring.

In the illustration in FIG. 1, there are also sensor signal converters GU1, GU2 on the drive regulators AR3 and AR4. In this case, the sensor signal converters GU1, GU2 may be an integral part of the drive regulators AR1 to AR5 or may be arranged externally thereto.

In the illustration in FIG. 1, the drive regulator AR5 is not equipped with a drive bus AB1 to AB4 having real-time capability. To couple this drive to the drives having the drive regulators AR1 to AR4, a sensor signal converter GU2 is arranged on the drive regulator AR4, said sensor signal converter receiving sensor signals from the sensors G1, G2 in real time, and depending on configuration, sending a sensor value to the drive regulator AR5. The drive bus AB1 to AB4 having real-time capability means that it does not matter which drive regulator AR1 to AR4 has the sensor G1, G2 whose information is to be sent to the drive regulator AR5. The sensor G1 is mechanically coupled to the motor M1, which is shown in the illustration shown in FIG. 1 by two lines connecting the sensor G1 to the motor M1.

By way of example, the drives having the drive regulators AR1 to AR4 may be arranged in a production machine in which the motor M1 releases a product of the machine. A sensor G1 detects the position of the motor M1 and sends this signal to the drive regulator AR1. This drive regulator sends the information via the drive bus AB1 to AB4 having real-time capability to the drive regulator AR4. There, the actual position value of the motor M1 is converted into sensor-compatible pulsed signals in the sensor signal converter GU2. These signals are transmitted to the drive regulator AR5 controlling the motor M5. By way of example, this motor may operate a conveyor belt which is coordinated with the production machine and is used to transport the finished product away.

When production installations are re-equipped, drives from different manufacturers may need to be connected to one another. However, these do not always have bus interfaces which can be used to communicate using compatible bus protocols. In this case, it is possible to produce an item of drive information, for drives which are to be coupled, using a sensor G1, G2 which is to be installed, since drive regulators AR1 to AR5 usually have sensor interfaces. In addition, the procedure described may represent an inexpensive alternative when it is not possible to equip a drive with a data link AB1 to AB4 having real-time capability for cost reasons.

The measured signals from the sensors G1, G2 can be flexibly assigned to the sensor converters GU1, GU2 via the drive bus AB1 to AB4 in the system. By way of example, this can be done using the control computer L, which is able to collect, evaluate and possibly display superordinate process data. It is also conceivable for the control computer L to be able to be used to configure the installation.

Finally, it should be mentioned that the use of an Ethernet having real-time capability permits the use of a standardized bus protocol which can be used universally. The Ethernet provides a high transmission capacity and represents an inexpensive alternative to existing drive bus systems.

I claim:

1. A sensor signal converter system for machines which generate pulsed signals from sensor values comprising at least one sensor signal converter and at least one bus drive for transmitting sensor signals in real time, wherein the sensor signals are converted into sensor-compatible pulsed signals by the at least one sensor signal converter in real time, and further wherein converted signals can be sent to at least one appliance in real time.

2. The sensor signal converter system according to claim 1, further comprising a control computer for generating synthetic nominal values for the at least one sensor signal converter, and/or at least one drive regulator.

3. The sensor signal converter system according to claim 2, wherein the control computer can be sent nominal values from at least one further automation component.

4. The sensor signal converter system according to claim 3, wherein a real and a synthetic nominal value source can be flexibly assigned to at least one sensor signal converter using a control computer and/or a drive regulator.

5. The sensor signal converter system according to claim 4 wherein a real and a synthetic nominal value source can be flexibly assigned during operation of the machine.

6. The sensor signal converter system according to claim 1, further comprising a clock signal in the sensor signal converter, and a communication clock in the bus drive, and wherein said clock signal is synchronized with said communication clock.

7. The sensor signal converter system according to claim 1, wherein the sensor signal converter is an integral part of a drive regulator.

8. The sensor signal converter system according to claim 1, wherein at least one real-time bus drive which can be used for the drive regulator is an Ethernet having real-time capability.

* * * * *